(12) United States Patent
Toughlian et al.

(10) Patent No.: US 6,420,985 B1
(45) Date of Patent: Jul. 16, 2002

(54) PHOTONIC WIDE-BAND ANALOG TO DIGITAL CONVERTER AND METHOD

(75) Inventors: Edward N. Toughlian, Melbourne; Henry Zmuda, Niceville, both of FL (US)

(73) Assignee: ENSCO Inc., Springfield, VA (US)

( * ) Notice: Subject to any disclaimer, the term of this patent is extended or adjusted under 35 U.S.C. 154(b) by 0 days.

(21) Appl. No.: 09/552,676

(22) Filed: Apr. 19, 2000

Related U.S. Application Data

(60) Provisional application No. 60/130,105, filed on Apr. 20, 1999.

(51) Int. Cl.[7] ............................................. H03M 1/00
(52) U.S. Cl. ...................................... 341/137; 341/155
(58) Field of Search ................................ 341/137, 120, 341/118, 155; 250/225

(56) References Cited

U.S. PATENT DOCUMENTS

| | | | |
|---|---|---|---|
| 4,571,576 A | 2/1986 | Olsson et al. ............... 340/347 |
| 4,694,276 A | 9/1987 | Rastegar ...................... 340/347 |
| 4,831,376 A | 5/1989 | Reid et al. .................... 341/13 |
| 4,947,170 A | 8/1990 | Falk ............................ 341/137 |
| 4,964,276 A | 10/1990 | Sturdy ......................... 60/700 |
| 5,381,147 A * | 1/1995 | Birkmayer ................... 341/137 |
| 5,831,147 A | 11/1998 | Hoath ......................... 73/49.3 |
| 6,118,396 A * | 9/2000 | Song ........................... 341/137 |
| 6,118,397 A * | 9/2000 | Heflinger .................... 341/137 |
| 6,175,320 B1 * | 1/2001 | Heflinger .................... 341/137 |
| 6,188,342 B1 * | 2/2001 | Gallo .......................... 341/137 |

* cited by examiner

*Primary Examiner*—Tuan T. Lam
(74) *Attorney, Agent, or Firm*—Nixon Peabody LLP; Daniel W. Sixbey; Jeffrey L. Costellia

(57) ABSTRACT

A photonic, wide-band analog to digital converter and method for converting an analog electrical signal to a digital electrical signal by electrical signal processing wherein the analog electrical signal is first converted to an optical signal having a wavelength which is a function of the amplitude of said analog electrical signal. The optical signal is then filtered in a plurality of optical filter channels to create N optical bit signals forming an N bit binary word indicating the wavelength of said optical signal. These optical bit signals are then each converted to an electrical bit signal to form an electrical binary word.

21 Claims, 2 Drawing Sheets

PHOTONIC WIDE-BAND ANALOG TO DIGITAL CONVERTER AND METHOD

This application is a continuation-in-part application of U.S. Ser. No. 60/130,105 filed Apr. 20, 1999.

BACKGROUND ART

Spread-spectrum communications, microwave signal processing, phased array antenna systems, and digital RF memory are but a few of the applications where extremely broadband signal processing, in some cases several gigahertz, is required. High resolution state-of-the-art (commercial off-the-shelf Analog to Digital Conversion Systems ADCs) have a conversion rate of less than a hundred megahertz. Consequently, the conversion rate of an ADC presents a major bottleneck to the digital processing speed. To accommodate the need for broadband data acquisition and processing, present systems sometimes employ sub-band coding techniques. Using these techniques, the analog signal to be digitized is first passed through a bank of band-pass filters. The bandwidth-reduced output of each of these filters is then separately digitized and coded so that the digital representation retains all the information contained in the original analog signal. Although effective, this process is computationally intensive and thus unsuitable for real time high-speed applications.

Though the advantages of optical processing for broadband signals are well known, such processing is often analog, not digital, in nature and usually application specific. However, optical techniques for realizing analog to digital conversion have been developed, as illustrated by U.S. Pat. No. 4,571,576 to Olsson et al. This patent discloses a high speed analog to digital converter that uses a frequency tunable laser that emits radiation at a frequency which is determined by an input voltage. The device uses a grating which disperses and directs particular wavelengths of the radiation to an array of photo-detectors. Each photo-detector receives and detects radiation of one wavelength from the grating and converts the radiation into a digitized signal.

Also U.S. Pat. No. 4,964,276 to Rastegar discloses the use of an optical reflective grating in an optical analog to digital converter.

Many prior optical techniques for implementing analog to digital conversion have been hybrid electrical/optical systems, such as systems using a pulsed laser as a means to rapidly sample an analog signal. The samples are then M-decimated and routed into M optical channels. Each channel is photo-detected and the output is directed into one of a bank of low speed electronic analog to digital converters which function in parallel. The binary outputs from each of the ADC's is time multiplexed to reassemble the binary word corresponding to the broadband input. Though a laser and modulator are used to sample the analog signal, the ADC is otherwise of the traditional electronic type.

SUMMARY OF THE INVENTION

It is a primary object of the present invention to provide a novel and improved analog to digital converter and method which is completely optical and capable of achieving the rapid conversion rate necessary for the digital processing of extremely broadband signals.

Another object of the present invention is to provide a novel and improved analog to digital conversion method using all-optical signal processing providing conversion rates several orders of magnitude faster than the fastest electronic processor.

Yet another object of the present invention is to provide a photonic wide-band analog to digital converter with a minimum number of active components amenable to integration in the form of a photonic integrated circuit.

A further object of the present invention is to provide a photonic wide-band analog to digital converter which is lightweight, compact, operates on a low power budget and is fully compatible with optical fiber-based data distribution links. For an N-bit analog to digital converter, one laser and N photo-detectors are the only active components required.

A still further object of the present invention is to provide a method for converting an analog electrical signal to a digital electrical signal by means of optical signal processing. The analog electrical signal is converted by a tunable laser to an optical signal which is a function of the amplitude of the analog signal. This optical signal is converted in an optical processor to optical bit signals which form an N bit binary word, and these optical bit signals are then converted to electrical bit signals.

These and other objects of the present invention are achieved by providing an analog electrical signal to be digitized to a tunable laser which provides an optical output signal having an optical wavelength which is a function of the amplitude of the analog electrical signal. An optical processor is connected to receive the optical output signal and to convert it to an N bit binary word. This processor includes N separate optical bit legs which each include optical filters for providing an optical output bit signal indicative of one bit of the N bit binary word. Photo-detectors connected to the optical processor operate to convert the optical bit signals to electrical bit signals.

BRIEFS DESCRIPTION OF THE DRAWINGS

DESCRIPTION OF THE PREFERRED EMBODIMENT

Figure 1:
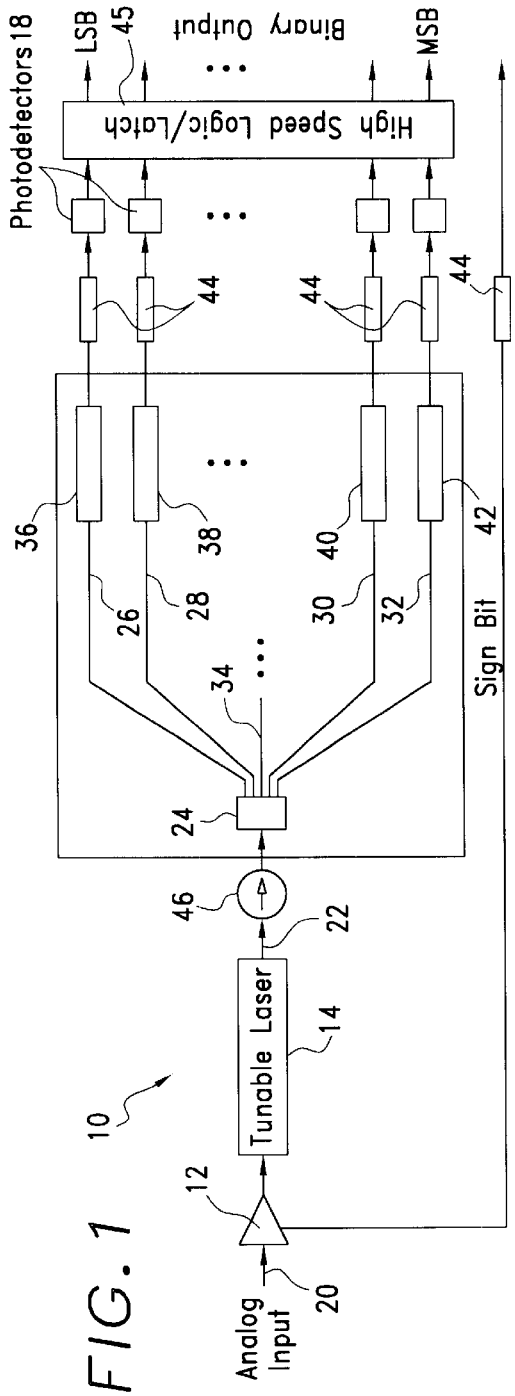
FIG. 1 is a block diagram of the photonic, wide-band analog to digital converter of the present invention.

The basic photonic wide-band analog to digital converter of the present invention indicated generally at 10 in FIG. 1 includes an analog signal conditioning unit 12, a tunable laser 14, a photonic processor 16 and a plurality of photo-detectors 18. The tunable laser receives an analog signal to be digitized from an input 20 and converts that signal to an optical frequency or wavelength at the laser output 22.

The system will function whether designed for linear tuning in frequency or wavelength, assuming that the processor is designed to map in a consistent way with the tunable laser approach selected. Most tunable laser and processor approaches naturally track linearly in frequency. To aide in clarity, optical signals in this description may be represented by either their optical frequency or wavelength equivalent, but for optimal performance, the laser and processor must be designed using a common mapping convention. The mapping between the input voltage at 20 and the optical frequency is ideally linear. If the relationship is other than linear, then either the input signal must be preconditioned to linearize the voltage to optical frequency conversion, or alternatively, the deviation from linear must be accounted for in the design of the processor portion of the system.

To illustrate the operation of the processor 16, a four bit analog to digital converter 10 is shown in FIG. 1 which in FIG. 2 uses the binary code of Table 1 below and in FIG. 3 uses the Gray code logic of Table 1:

TABLE 1

| Wavelength Assignment | Binary Count MSB | LSB | Gray-Coded Binary Count |
|---|---|---|---|
| $V_0 \rightarrow \lambda_0$ | 0000 | | 0111 |
| $V_1 \rightarrow \lambda_1$ | 0001 | | 0110 |
| $V_2 \rightarrow \lambda_2$ | 0010 | | 0100 |
| $V_3 \rightarrow \lambda_3$ | 0011 | | 0101 |
| $V_4 \rightarrow \lambda_4$ | 0100 | | 0001 |
| $V_5 \rightarrow \lambda_5$ | 0101 | | 0000 |
| $V_6 \rightarrow \lambda_6$ | 0110 | | 0010 |
| $V_7 \rightarrow \lambda_7$ | 0111 | | 0011 |
| $V_8 \rightarrow \lambda_8$ | 1000 | | 1011 |
| $V_9 \rightarrow \lambda_9$ | 1001 | | 1010 |
| $V_{10} \rightarrow \lambda_{10}$ | 1010 | | 1000 |
| $V_{11} \rightarrow \lambda_{11}$ | 1011 | | 1001 |
| $V_{12} \rightarrow \lambda_{12}$ | 1100 | | 1101 |
| $V_{13} \rightarrow \lambda_{13}$ | 1101 | | 1100 |
| $V_{14} \rightarrow \lambda_{14}$ | 1110 | | 1110 |
| $V_{15} \rightarrow \lambda_{15}$ | 1111 | | 1111 |

In Table 1, $2^N=16$ discrete possible voltages to be digitized which are represented by their corresponding wavelengths that would be output from the tunable laser 14 (N is the number of bits of resolution). The second column and third column indicate the desired equivalent binary word for a standard mapping as well as a Gray coded mapping, respectively. Since rapid decoding is possible with post-detection logic, any coding scheme could be employed.

The optical signal from the tunable laser 14 is split N ways by an optical splitter 24 at the input to the processor 16 and apportioned to each of N bit legs 26, 28, 30, 32 and additional N bit legs 34. Each of the N bit legs includes its own filter elements 36, 38, 40 and 42 whose transfer function corresponds to the pattern of 0's (logical zeros) and 1's (logical one's) as indicated in the columns for the binary count (or the Gray-coded binary count) in Table 1. These filter functions will block those wavelengths that are indicated by a logical zero, while those that correspond to a logical one are allowed to propagate with minimal loss to a spectrally broad (i.e. capable of detecting all wavelengths within the laser tuning range of interest) photo-detector 18. For example, for the MSB of the standard binary count approach, wavelengths $\lambda 0$ through $\lambda 7$ must be blocked from the output and all other wavelengths should pass to the output unimpeded or at least with minimal attenuation.

As with any digital circuit it is necessary to ensure that each bit arrives at the output port at the same time. That is, the differential path lengths of each bit-leg, from the point of splitting to detection and storage is critical, and the propagation time corresponding to those differential lengths should correspond to a very small fraction of the desired ADC system speed, otherwise all bit leg outputs will not be synchronized to the input signal. This delay equalization is easily achieved by adding the proper amount of additional optical signal delay units such as fixed lengths of optical fiber (path trimmers) 44 to each bit leg as shown. This (fixed) path length adjustment need not be included if accurate path lengths are provided in manufacturing. The exact ADC system configuration will depend on the specific user application.

It is generally necessary to decode the resulting coded binary output to produce the desired binary representation of the analog voltage level. This is easily achieved electronically after the photo-detectors using a variety of fast (synchronous or asynchronous) logic. Electronic latches 45 can be included to hold the binary word until the new one arrives.

If necessary, the analog input signal may first undergo electronic signal conditioning and sign bit extraction at 20. Generally, signal conditioning may include level shifting and amplitude conditioning such as by logarithmic amplifiers. These capabilities (sign bit extraction, signal conditioning, etc.), although typically present in electronic ADC systems, are mentioned here for completeness, and do not imply that the system will not otherwise perform without these components. Additionally, if the return loss of the splitter 24 does not sufficiently suppress optical energy reflected back from the processor filter elements to the laser, then an isolator 46 is included in the circuit as shown in FIG. 1.

Figure 2:
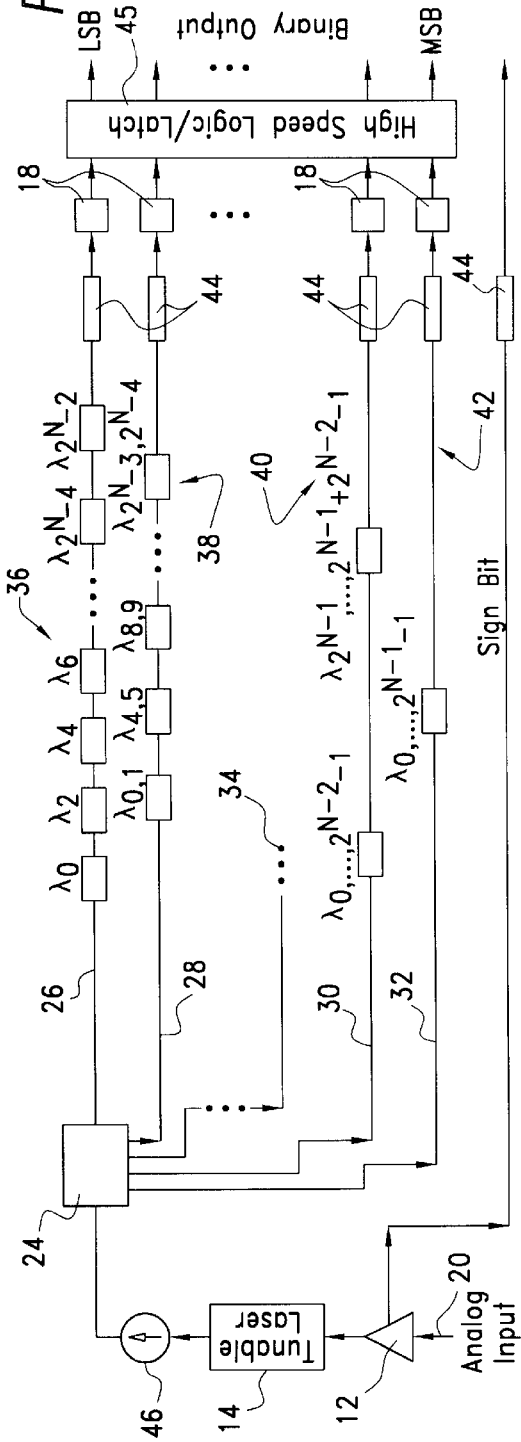
FIG. 2 is a block diagram of the photonic, wide-band analog to digital converter of FIG. 1 showing a first optical filter construction using a standard binary configuration.

FIG. 2 illustrates a standard binary count realization of the processor 16 using discrete filters. With the binary count configuration we have the option of using one filter element to create a logical zero for each of the required zeros in the logic table. This requires a large number of filter elements, specifically $N2^{N-1}$ filter elements. Alternatively, a reduction in the number of discrete filter elements can be realized by noting from the logic table that the zeros occur in groups (at least for all bits other than the LSB). This grouping implies the need for broader bandwidth filters but if fully taken advantage of, results in a factor of N reduction in the number of filter elements required, from $N2^{N-1}$ to $2^{N-1}$.

Figure 3:
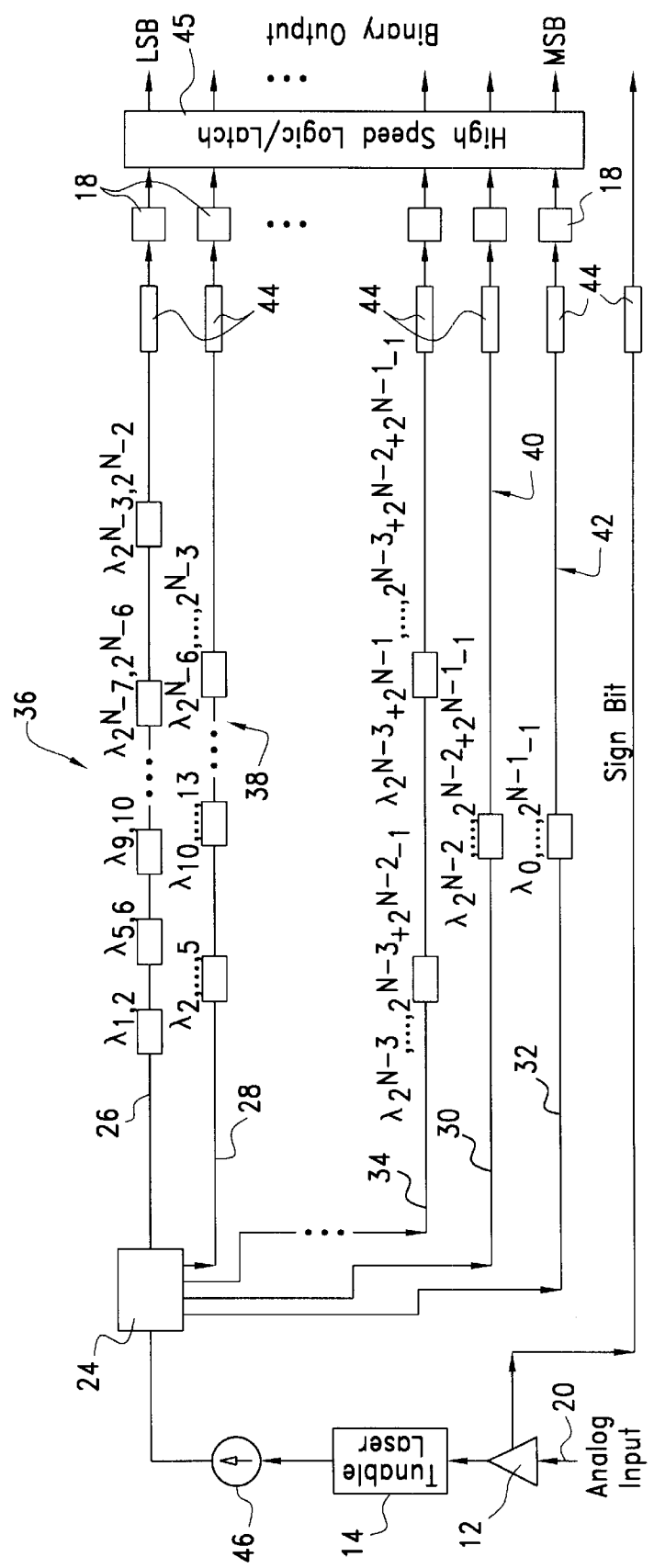
FIG. 3 is a block diagram of a second embodiment of the photonic wide-band analog to digital converter showing a second optical filter construction using a Gray-Coded configuration.

To provide a reduction in errors and system complexity the processor can be configured to count using a Gray code as illustrated in FIG. 3. There are two distinctive features of arranging the binary word in this way. Firstly, the characteristics of the Gray code ensure that wavelength quantization errors affect only the LSB. This benefit comes about because the increased size of the zero groupings reduces the systems susceptibility to laser jitter and other potential noise components. Secondly, the groupings of the zeros further minimize the number of filter elements required, specifically, $2^{N-2}$ discrete filter elements would be required if all groupings of logical zeros were fully taken advantage of.

One potential filter-function realization for discrete ADC architectures is fiber or waveguide-based Bragg reflection gratings (BRGs). The reflection bandwidth and peak reflectivity of these devices are readily controlled design parameters. BRGs with reflection bandwidths as narrow as 0.01 nanometers or as broad as 100 nanometers are available from several manufacturers as commercial off-the-shelf products. Broad reflection bandwidths are obtained by using a chirped rather than periodic index variation. Reflectivity at the Bragg wavelength can be as low as 1% or greater than 99.9% and off-wavelength transmission is nearly 100%, making BRG's an extremely efficient and versatile optical design element for use as the filters 36, 38, 40 and 42

The tunable laser 14 converts the ADC problem from one of resolving a voltage to one of resolving a wavelength. For an N-bit ADC, $2^N$ distinct wavelengths ($\lambda_0$ through $\lambda_{2^N-1}$) must be resolvable. The criteria for a resolvable line is determined by the reflection bandwidth characteristics of the BRG. The smallest BRG passband B must be at least as great as the laser linewidth, otherwise crosstalk or bit leakage will occur, and may be made larger to accommodate any laser wavelength jitter. Therefore, the tuning range (free spectral range) of the laser 14 excluding any guard bands must be at least $2^N B$. The laser may be either pulsed or continuous wave. A pulsed laser has the advantage of providing a high-speed clock signal for synchronization with other (external) logic devices. As shown FIG. 2, standard directional couplers can be used for signal splitting and steering, as can a variety of devices. Specifically, suppose an input (analog) signal voltage level $v_i$ with binary representation:

$$B_i = \{b_n, b_{N-1}, \ldots b_1, b_0\}$$

produces an associated wavelength $\lambda_i$. The split ratios of the directional couplers/optical splitters 24 are chosen to divide the optical power equally among each BRG bank. Other split ratios and configurations are possible. The $m^{th}$ BRG bank is designed so that if the $m^{th}$ binary digit of $B_i$ is a logical zero, then branch m contains a BRG that reflects $\lambda_i$, otherwise $\lambda_i$ passes through all BRG;s in that branch and is detected as a logical one by a spectrally broad (i.e. capable of detecting all wavelengths within the laser tuning range of interest) photo-detector 18. Temporal bandwidths of commercial photo-detectors can exceed 100 GHz, hence they impose a speed limitation only at extremely high frequencies.

Ideally, the filter reflectors to be used with have very sharp stop-band transitions. This will result in maximum margins between neighboring high and low states, thereby minimizing the possibility of quantization error. Additionally, the filter period should be as small as possible to minimize the tuning range requirement, but not so small as to result in errors in the presence of laser noise, thereby burdening the laser with more stringent jitter specifications. The stop band requirements for the filter elements are ideally 100% reflecting at the desired wavelengths and 100% transmissive with zero loss at wavelengths inside its passband.

Referring back to the logic in Table 1, it is seen that the "1" and "0" patterns of each bit-leg are periodic, and in fact can be realized by a square-wave transfer function. The exploitation of this characteristic ideally reduces the required number of filter elements to its minimum, namely N; i.e. one filter element for each bit-leg. This approach closely resembles the system depicted in FIG. 1. Further reduction would only be possible if the bit-legs could share a single filter element that could be tapped at the appropriate point along the filter element prior to detection.

Several approaches exist that provide periodic transfer functions which have characteristics that can be tailored to reasonably model the square-wave transfer function desired. The two most promising approaches are the Mach-Zehnder filter and Fabry-Perot filters. The Mach-Zehnder filter approach includes a splitting element followed by an array of weighted waveguides that have a constant differential path length from array element-to-element, which are then optically summed, leading to a single output. The weights on the waveguides are the Fourier coefficients required for a square wave, namely a $\sin(x)/x$ distribution. The weights for the square wave case are real, with the requirement that some elements might require negation. One way to accomplish this is by exploiting the $\pi/2$ phase shift that accompanies the split from one of the ports of a directional coupler. The Mach-Zehnder filter approach can be realized using arrayed waveguide filters, which are commercially available with as many as 150 or more waveguides. The more waveguides, the more terms of the Fourier series that are being used to define the square wave. Typically, as few as ten waveguides can provide the square wave characteristics and sufficient margin required for most ADC applications. Other Mach-Zehnder configurations such as cascade or even hybrid configurations can also be used in conjunction with various synthesis approaches. For example, Finite Impulse Response (FIR) synthesis configurations are also highly advantageous and can potentially eliminate the need for amplitude weighting.

The Fabry-Perot filter approach consists of two reflecting surfaces separated by a gap or cavity where the length of cavity defines the location of the resonant peaks (and anti-resonant valleys). The reflectivity of the reflecting surfaces defines the sharpness of the resonances. These devices are also readily integrated into a rib waveguide, although the reflectivity realized is quite low and hence the finesse of the Fabry-Perot filter will be significantly reduced.

Is it quite possible that a hybrid, or variety of filtering approaches may be required for the processor 16. For example, the Mach-Zehnder filter approach can provide very sharp high rep-rate square wave transfer functions, but falters when it comes to the lower rep-rate transfer functions that might be required by the MSB and its neighboring bits. For the MSB and neighboring bits it will probably make the most sense to use discrete BRGs, as they can have very large optical bandwidths with very sharp transitions. For the bits-in-between it might make sense to use Fabry-Perot filters as they offer a trade-off between finesse and rep-rate.

The selection of the laser 14 requires at least three critical characteristics that must be identified, from an energy budget and noise quantization error standpoint, prior to laser selection. These include power output, wavelength jitter/noise, and amplitude jitter/noise.

Determination of the laser power requirement can be accomplished by evaluating the maximum laser power that might appear at a detector 18 when a logical zero is intended. This includes evaluating worst-case leakage through each bit-leg filter element, including energy from back reflections from the other legs that might cross couple as well as noise from the detector, laser wavelength jitter, or other sources. This analysis provides a quantification of the minimum signal threshold level for a logical one that should be used at the output of the detector. The laser power is then selected such that the logical one output at each detector 18 is larger than the threshold level. This will ensure, to within the design probability, that an intended logical one will not be misinterpreted as a logical zero.

For an N-bit ADC, $2^N$ distinct wavelengths ($\lambda_0$ through $\lambda_{2N-1}$) must be resolvable. The criteria for a resolvable line is determined by the reflection bandwith characteristics of the BRG. The smallest BRG passband B must be at least as great as the laser linewidth, otherwise crosstalk or bit leakage will occur. Therefore, the tuning range (free spectral range) of the laser excluding any guard bands must be at least $2^N B$. The smallest BRG may of course be made larger to accommodate any laser wavelength jitter.

Assuming identical detectors 18 for each binary output, selecting splitters or directional couplers 24 that result in an equal amount of energy appearing at each detector will minimize the laser power needed. Note however, that smaller probability of error may be assigned to the more significant bit-legs by allocating more laser power to these bits.

The three most important characteristics with regard to the selection of detectors 18 are speed, sensitivity, and optical bandwidth. Temporal bandwidths of commercial photo-detectors can exceed 100 GHz, hence they impose a speed limitation only at extremely high frequencies. The required sensitivity of the detector is a function of the laser power divided by the N-way split minus any excess losses the optical energy experiences prior to the detector. This parameter is readily evaluated once a final design has been confirmed. If detectors do not exist with sufficient sensitivity, then it is possible to increase the signal level by either a signal optical amplifier after the laser but prior to splitting or amplification at each bit-leg. Of course amplification may add some minimal amplitude jitter, but the ADC design presented here is quite robust with regard to amplitude noise. With regard to optical bandwidth, virtually any high speed, low noise detector with an optical bandwidth at least as great as the required laser tuning range can be used, and such spectrally broad detectors are common.

We claim:

1. A photonic, wide band analog to digital converter for converting an analog electrical signal to a digital electrical signal comprising:

a tunable laser for receiving the analog electrical signal and providing an optical output signal having an optical wavelength which is a function of the amplitude of said analog electrical signal, an optical processor for receiving said optical output signal and responding to the optical wavelength thereof to convert said optical output signal to an N bit binary word, said optical processor including at least N separate optical bit legs, each said bit leg including an optical wavelength responsive optical filter for providing an optical output bit signal indicative of one bit of said N bit binary word, and an N number of photo-detectors connected to said optical processor, each of said photo-detectors being connected to a bit leg to receive an optical output bit signal from the optical filter for said bit leg and operating to convert said optical output bit signal to an electrical bit signal.

2. The photonic wide-band analog to digital converter of claim 1 wherein said optical filters are formed by reflection gratings.

3. The photonic wide-band analog to digital converter of claim 1 which includes an optical splitter connected to receive the optical output signal from said tunable laser, said optical splitter operating to split said optical output signal into N split optical signals and to provide one of said N split optical signals to each said bit leg of said optical processor.

4. The photonic wide-band analog to digital converter of claim 2 wherein said optical filters are Bragg reflection gratings.

5. The photonic wide-band analog to digital converter of claim 2 wherein the optical filter in at least one bit leg of said optical processor is Bragg reflection grating, the optical filter in at least one bit leg is a Mach-Zehnder filter and the optical filter in at least one bit leg is a Fabry-Perot filter.

6. The photonic wide-band analog to digital converter of claim 1 wherein each said bit leg of said N bit legs is formed to provide an optical bit signal to a photo-detector connected to said bit leg substantially simultaneously with the provision of an optical bit signal by the remaining N bit legs to the photo-detectors connected thereto.

7. The photonic wide-band analog to digital converter of claim 6 wherein an optical signal delay unit is provided in a plurality of said bit legs between the optical filter and the photo-detector connected to said bit leg.

8. The photonic wide-band analog to digital converter of claim 3 wherein said optical splitter divides optical power from said optical output signal equally between said N split optical signals.

9. The photonic wide-band analog to digital converter of claim 3 wherein each said bit leg of said N bit legs is formed to provide an optical bit signal to a photo-detector connected to said bit leg substantially simultaneously with the provision of an optical bit signal by the remaining N bit legs to the photo-detectors connected thereto.

10. The photonic wide-band analog to digital converter of claim 9 wherein said optical filters are formed by reflection gratings.

11. The photonic wide-band analog to digital converter of claim 10 wherein said optical filters are Bragg reflection gratings.

12. The photonic wide-band analog to digital converter of claim 10 wherein the optical filter in at least one bit leg of said optical processor is Bragg reflection grating, the optical filter in at least one bit leg is a Mach-Zehnder filter and the optical filter in at least one bit leg is a Fabry-Perot filter.

13. The photonic wide-band analog to digital converter of claim 9 wherein said optical splitter divides optical power from said optical output signal equally between said N split optical signals.

14. The photonic wide-band analog to digital converter of claim 2 wherein each optical filter provides a single optical output bit signal for a bit leg.

15. The photonic wide-band analog to digital converter of claim 14 wherein said N bit binary word is formed by logical zeros and logical ones, said wavelength responsive optical filters operating to block optical wavelengths indicative of logical zeros.

16. The photonic wide-band analog to digital converter of claim 15 which includes an optical splitter connected to receive the optical output signal from said tunable laser, said optical splitter operating to split said optical output signal into N split optical signals having equal optical power and to provide one of said N split optical signals to each said bit leg of said processor.

17. The photonic wide-band analog to digital converter of claim 16 wherein a logic latch is connected to receive the electrical bit signal from each of said photo-detectors, said logic latch operating to hold the electrical bit signals for an N bit binary word until electrical bit signals for a new N bit binary word are received by said logic latch.

18. The photonic wide-band analog to digital converter of claim 17 wherein an optical isolator is connected between said tunable laser and said optical processor to suppress optical energy reflected by said optical filters.

19. The photonic wide-band analog to digital converter of claim 18 wherein each said bit leg of said N bit legs is formed to provide an optical bit signal to a photo-detector connected to said bit leg substantially simultaneously with the provision of an optical bit signal by the remaining N bit legs to the photo-detectors connected thereto.

20. The photonic wide-band analog to digital converter of claim 19 wherein said optical filters are Bragg reflection gratings.

21. The photonic wide-band analog to digital converter of claim 19 wherein the optical filter in at least one bit leg of said optical processor is Bragg reflection grating, the optical filter in at least one bit leg is a Mach-Zehnder filter and the optical filter in at least one bit leg is a Fabry-Perot filter.

* * * * *

UNITED STATES PATENT AND TRADEMARK OFFICE
CERTIFICATE OF CORRECTION

PATENT NO. : 6,420,985 B1
DATED : July 16, 2002
INVENTOR(S) : Edward N. Toughlian et al.

It is certified that error appears in the above-identified patent and that said Letters Patent is hereby corrected as shown below:

<u>Column 1,</u>
Line 6, insert:
-- GOVERNMENT LICENSE RIGHTS

The U.S. Government has a paid-up license in this invention and the right in limited circumstances to require the patent owner to license others on reasonable terms as provided by the terms of AF Contract F30602-99-C-0017 awarded by the U.S. Department of the Air Force. --.

Signed and Sealed this

Sixteenth Day of May, 2006

JON W. DUDAS
*Director of the United States Patent and Trademark Office*